(12) United States Patent
Mathew et al.

(10) Patent No.: US 6,903,967 B2
(45) Date of Patent: Jun. 7, 2005

(54) MEMORY WITH CHARGE STORAGE LOCATIONS AND ADJACENT GATE STRUCTURES

(75) Inventors: Leo Mathew, Austin, TX (US); Robert F. Steimle, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/443,908

(22) Filed: May 22, 2003

(65) Prior Publication Data

US 2005/0057964 A1 Mar. 17, 2005

(51) Int. Cl.$^7$ .............................................. G11C 11/34
(52) U.S. Cl. .................... 365/177; 365/185.33; 257/51; 257/313
(58) Field of Search ........................... 365/177, 185.33, 365/185.03, 185.18, 185.28, 185.29; 257/51, 313, 353, 302

(56) References Cited

U.S. PATENT DOCUMENTS

| | | | |
|---|---|---|---|
| 4,859,623 A | 8/1989 | Busta | |
| 5,689,127 A | 11/1997 | Chu et al. | |
| 5,804,848 A | 9/1998 | Mukai | |
| 6,011,725 A | 1/2000 | Eitan | |
| 6,097,065 A | 8/2000 | Forbes et al. | |
| 6,150,687 A | 11/2000 | Noble et al. | |
| 6,300,182 B1 | 10/2001 | Yu | |
| 6,330,184 B1 | 12/2001 | White et al. | |
| 6,355,961 B1 | 3/2002 | Forbes | |
| 6,372,559 B1 | 4/2002 | Crowder et al. | |
| 6,396,108 B1 | 5/2002 | Krivokapic et al. | |
| 6,413,802 B1 | 7/2002 | Hu et al. | |
| 6,414,356 B1 | 7/2002 | Forbes et al. | |
| 6,424,001 B1 * | 7/2002 | Forbes et al. ............... 257/315 |
| 6,433,609 B1 | 8/2002 | Voldman | |
| 6,458,662 B1 | 10/2002 | Yu | |
| 6,472,258 B1 | 10/2002 | Adkisson et al. | |
| 6,531,350 B2 | 3/2003 | Satoh et al. | |
| 6,566,682 B2 * | 5/2003 | Forbes ........................ 257/51 |
| 6,583,469 B1 | 6/2003 | Fried et al. | |
| 6,689,650 B2 | 2/2004 | Gambino et al. | |
| 6,720,216 B2 * | 4/2004 | Forbes ....................... 438/257 |
| 6,768,158 B2 | 7/2004 | Lee et al. | |
| 6,846,734 B2 | 1/2005 | Amos et al. | |
| 2003/0113970 A1 | 6/2003 | Fried et al. | |

FOREIGN PATENT DOCUMENTS

| | | |
|---|---|---|
| DE | 101 25 967 C1 | 5/2001 |
| WO | WO 00/21118 | 4/2000 |

OTHER PUBLICATIONS

Choi et al., "Sub–20 nm CMOS FinFET Technologies," 0–7803–7052–X/01 IEEE, 2001, 4 pps.

Fossum et al., "Extraordinarily High Drive Currents in Asymmetrical Double–Gate MOSFETs," *Superlattices and Microstructures*, vol. 28, No. 5/6, 2000, pp. 525–530.

Gonzalez, Sr. et al., "A Dynamic Source–Drain Extension (DSDE) MOSFET Using a Separately Biased Conductive Spacer," pp. 645–648.

(Continued)

*Primary Examiner*—Gene N. Auduong
(74) *Attorney, Agent, or Firm*—David G. Dolezal; James L. Clingan, Jr.

(57) ABSTRACT

A memory having gate structures adjacent opposing sidewalls of a semiconductor structure including a channel region and a plurality of charge storage locations between the gate structures and the opposing sidewalls. The channel region is located between two current terminal regions, which in one example serve as the source/drain regions. A memory cell can be implemented in an array of memory cells wherein one gate structure is coupled to one word line and the other gate structure is coupled to another word line. In one example, each cell includes four charge storage locations, each for storing one bit of data.

38 Claims, 10 Drawing Sheets

OTHER PUBLICATIONS

Kedzierski et al., "High–performance Symmetric–gate and CMOS–compatible $V_t$ Asymmetric–gate FinFET Devices," *0–7803–7052–X/01 IEEE,* 2001, 4 pps.

Kim et al., "Double–Gate CMOS: Symmetrical–Versus Asymmetrical–Gate Devices," *IEEE Transactions on Electron Devices,* vol. 48, No. 2, Feb. 2001, pp. 294–299.

Tanaka et al., "Ultrafast Operation of $V_{th}$ –Adjusted $p^+$–$n^+$ Double–Gate SOI MOSFET's, " *IEEE Electron Devices Letters,* vol. 15, No. 10, Oct. 1994, pp. 386–388.

Yu et al., "FinFET Scaling to 10 nm Gate Length," *IEDM,* 2002, pp. 251–254.

U.S. Appl. No. 10/074,732 entitled "Method of Forming a Vertical Double Gate Semiconductor Device and Structure Thereof," filed Feb. 13, 2002, assignee same as assignee hereof.

U.S. Appl. No. 10/324,787 entitled "Vertical MOSFET with Asymmetric Gate Structure," filed Dec. 20, 2002, assignee same as assignee hereof.

Chan et al., "A True Single–Transistor Oxide–Nitride–Oxide EEPROM Device," *IEEE Electron Device Letters,* Mar. 1987, pp. 93–95, bik, EDL–8, No. 3.

Hisamoto et al., "FinFET–A Self–Aligned Double–Gate MOSFET Scalable to 20 nm," *IEEE Transactions on Electron Devices,* Dec. 2000, pp. 2320–2325, vol. 47, No. 12.

Lee et al., "Multilevel Verticle–Channel SONOS Nonvolatile Memory on SOI," *IEEE Electron Device Letters,* 2002, pp. 1–3 and 208–209.

* cited by examiner

CONDITIONS FOR BIT 1713

|         | $WL_0$    | $WL_1$   | $WL_2$   | $WL_3$   | $BL_0$    | $BL_1$    | $BL_2$   | $BL_3$   |
|---------|-----------|----------|----------|----------|-----------|-----------|----------|----------|
| PROGRAM | $V_{PP}$  | $V_{SS}$ | $V_{SS}$ | $V_{SS}$ | $V_{PP/2}$| $V_{PP/2}$| $V_{SS}$ | $V_{SS}$ |
| ERASE   | $-V_{PP}$ | $V_{SS}$ | $V_{SS}$ | $V_{SS}$ | $V_{SS}$  | $V_{PP}$  | $V_{SS}$ | $V_{SS}$ |
| READ    | $V_{DD}$  | $V_{SS}$ | $V_{SS}$ | $V_{SS}$ | $V_{SS}$  | $S_A$     | $V_{DD}$ | $V_{DD}$ |

*FIG.19*

CONDITIONS FOR BIT 1711

|         | $WL_0$   | $WL_1$    | $WL_2$   | $WL_3$   | $BL_0$   | $BL_1$   | $BL_2$     | $BL_3$     |
|---------|----------|-----------|----------|----------|----------|----------|------------|------------|
| PROGRAM | $V_{SS}$ | $V_{PP}$  | $V_{SS}$ | $V_{SS}$ | $V_{SS}$ | $V_{SS}$ | $V_{PP/2}$ | $V_{PP/2}$ |
| ERASE   | $V_{SS}$ | $-V_{PP}$ | $V_{SS}$ | $V_{SS}$ | $V_{SS}$ | $V_{SS}$ | $V_{PP}$   | $V_{SS}$   |
| READ    | $V_{SS}$ | $V_{DD}$  | $V_{SS}$ | $V_{SS}$ | $V_{DD}$ | $V_{DD}$ | $S_A$      | $V_{SS}$   |

*FIG.20*

|         | $WL_0$    | $WL_1$    | $WL_2$    | $WL_3$    | $BL_0$      | $BL_1$      | $BL_2$    | $BL_3$    |
|---------|-----------|-----------|-----------|-----------|-------------|-------------|-----------|-----------|
| PROGRAM | $V_{PP}$  | $-V_{PP}$ | $-V_{PP}$ | $-V_{PP}$ | $-V_{PP/2}$ | $-V_{PP/2}$ | $-V_{PP}$ | $-V_{PP}$ |
| ERASE   | $-V_{PP}$ | $V_{SS}$  | $V_{SS}$  | $V_{SS}$  | $V_{SS}$    | $V_{PP}$    | $V_{SS}$  | $V_{SS}$  |
| READ    | $V_{DD}$  | $V_{SS}$  | $V_{SS}$  | $V_{SS}$  | $V_{SS}$    | $S_A$       | $V_{DD}$  | $V_{DD}$  |

*FIG.21*

|         | $WL_0$    | $WL_1$    | $WL_2$   | $WL_3$   | $BL_0$    | $BL_1$    | $BL_2$      | $BL_3$      |
|---------|-----------|-----------|----------|----------|-----------|-----------|-------------|-------------|
| PROGRAM | $-V_{PP}$ | $V_{PP}$  | $V_{PP}$ | $V_{PP}$ | $-V_{PP}$ | $-V_{PP}$ | $-V_{PP/2}$ | $-V_{PP/2}$ |
| ERASE   | $V_{SS}$  | $-V_{PP}$ | $V_{SS}$ | $V_{SS}$ | $V_{SS}$  | $V_{SS}$  | $V_{PP}$    | $V_{SS}$    |
| READ    | $V_{SS}$  | $V_{DD}$  | $V_{SS}$ | $V_{SS}$ | $V_{DD}$  | $V_{DD}$  | $S_A$       | $V_{SS}$    |

*FIG.22*

MEMORY WITH CHARGE STORAGE LOCATIONS AND ADJACENT GATE STRUCTURES

RELATED APPLICATIONS

This application is related to the application entitled "Transistor With Independent Gate Structures" having inventors Leo Mathew, Robert F. Steimle, and Ramachandran Muralidhar, having an assignee of Motorola Inc., and having a filing date of herewith, which is hereby incorporated by reference in its entirety.

BACKGROUND OF THE INVENTION

1. Field of the Invention

This invention relates in general to a memory and specifically to a memory with charge storage locations.

2. Description of the Related Art

Some memories (e.g. non volatile memories) utilize charge storage locations of transistors for storing data. Examples of such memories include the film memories and floating gate memories. These type of memories may be implemented with planar CMOS transistors. The density of charge storage locations in a memory implementing planar transistors may be limited due to limitations in scalability such as e.g. contact area requirements. Furthermore, it may be difficult to implement a memory with planar (transistors in an integrated circuit with non planar transistors.

What is desirable is a memory that addresses the above concerns.

BRIEF DESCRIPTION OF THE DRAWINGS

The present invention may be better understood, and its numerous objects, features, and advantages made apparent to those skilled in the art by referencing the accompanying drawings.

FIG. 19 sets forth a table of one embodiment of a set of voltages applied to bitlines and word lines of a memory array for programming, erasing, and reading a charge storage location of the memory array according to the present invention.

FIG. 20 sets forth a table of one embodiment of a set of voltages applied to bitlines and word lines of a memory array for programming erasing, and reading another charge storage location of the memory array according to the present invention.

FIG. 21 sets forth a table of another embodiment of a set of voltages applied to bitlines and word lines of another memory array for programming, erasing, and reading a charge storage location of the memory array according to the present invention.

FIG. 22 sets forth a table of another embodiment of a set of voltages applied to bitlines and word lines of another memory array for programming, erasing, and reading another charge storage location of the memory array according to the present invention.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

Figure 1:
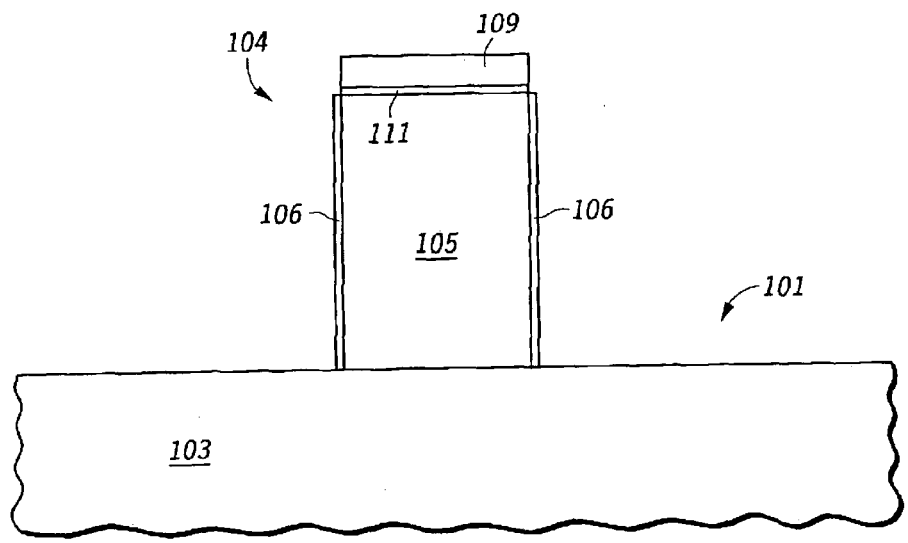
FIG. 1 is a partial side cross sectional view of one embodiment of a semiconductor wafer during a stage in the manufacture of a transistor according to the present invention.

FIG. 1 shows a partial side cross sectional view of one embodiment of a semiconductor wafer during a stage in the manufacture of a transistor with independent gate structures according to the present invention. Wafer 101 includes a substrate with an insulating layer 103. A structure 104 has been formed over insulating layer 103. Structure 104 includes a semiconductor structure portion 105 formed over insulating layer 103, a dielectric portion 111 (e.g. silicon dioxide) formed over semiconductor structure portion 105 and layer 103, and a nitride portion 109 located over portion 111 and portion 105. In one embodiment, structure 104 is formed by depositing a layer of semiconductor material over layer 103, forming a dielectric layer over the semiconductor layer (e.g. by thermal oxidation of the semiconductor layer or by atomic layer deposition of a high K dielectric), and then depositing a layer of nitride over the dielectric. The semiconductor layer, the dielectric layer, and the nitride layer are then patterned to form structure 104. Afterwards, a dielectric layer 106 is formed on the sidewalls of semiconductor structure portion 105. As will be shown later, a channel region and current terminal regions of a transistor are formed in semiconductor structure portion 105 of structure 104. In one embodiment, semiconductor structure portion 105 is made of epitaxial silicon bonded on insulating layer 104. In other embodiments, portion 105 may be made of polysilicon or other semiconductor material. In one embodiment, structure 104 is a fin structure of a FinFET. In other embodiments, portion 109 may be made of other materials (e.g. other dielectrics) that can be utilized as a hard etch mask.

Figure 2:
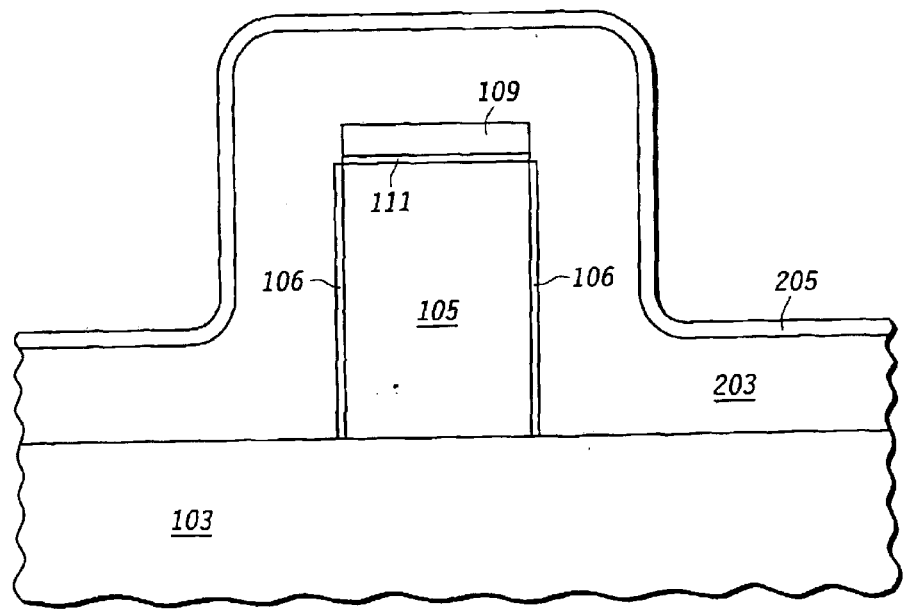
FIG. 2 is a partial side cross sectional view of one embodiment of a semiconductor wafer during another stage in the manufacture of a transistor according to the present invention.

Referring to FIG. 2, a conformal polysilicon layer 203 is deposited over wafer 101 including over structure 104. As will be shown later, polysilicon layer 203 is utilized to form independent gate structures of a FinFET transistor. In other embodiments, layer 203 may be made of other gate materials such as e.g. tungsten, titanium, tantalum silicon nitride, silicides such as cobalt or nickel silicides, germanium, silicon germanium, other metals, or combinations thereof. In the embodiment shown, a conformal nitride layer 205 is then deposited over layer 203. In one embodiment, layer 205 is used both as an antireflective coating and as a hard mask for etching layer 203. Layer 206 may not be included in some embodiments. In some embodiments, layer 203 may be doped prior to the deposition of layer 205. In these embodiments, layer 205 may be doped with single or multiple implants at various energies, angles, and/or species. For example, in one embodiment, the left side of layer 203, relative to the view shown in FIG. 2, may doped with a first dopant at a first angle to provide that portion with a first conductivity type, and the right side of the layer 203, relative to the view shown in FIG. 2 may be doped at a second angle relative to the view shown in FIG. 2 to provide that portion with a second conductivity type.

Figure 3:
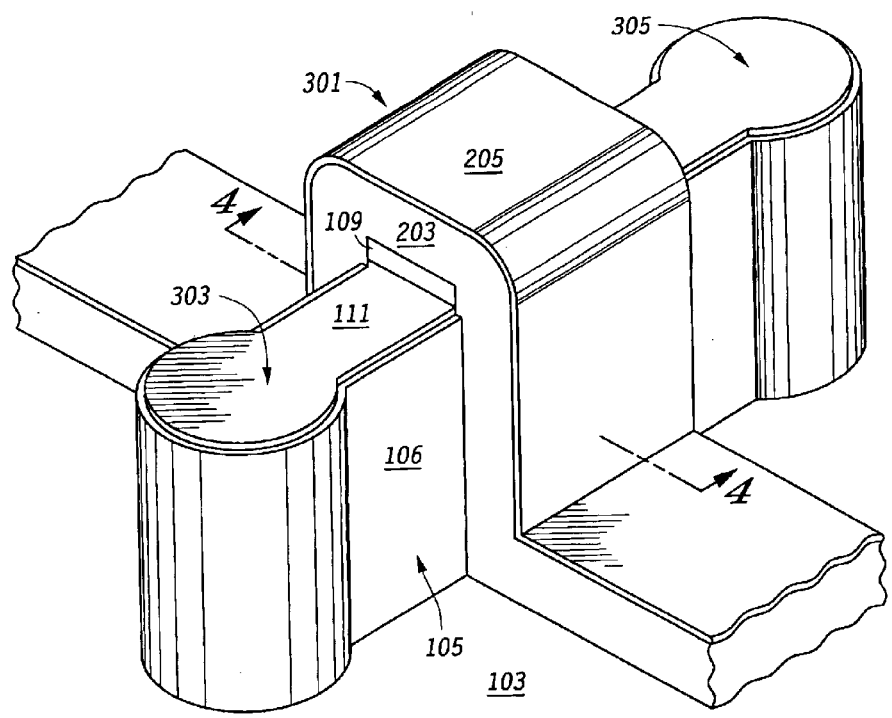
FIG. 3 is a partial isometric view of one embodiment of a semiconductor wafer during another stage in the manufacture of a transistor according to the present invention.

FIG. 3 is a partial isometric view of wafer 101 after layers 205 and 203 have been patterned to form gate structure 301. In some embodiments, layers 205 and 203 are patterned by the utilization of conventional photolithographic techniques. During the patterning, the portion of nitride portion 109 located over structure 104 but not located under gate structure 301 is removed. In other embodiments, this portion of nitride portion 109 may be removed at a later stage during manufacture.

Structure 104 includes current terminal regions 303 and 305 located in each end of portion 105 of structure 104. In one embodiment where the resultant transistor structure is a field effect transistor (FET), regions 303 and 305 serve as the source and drain regions, respectively. Regions 303 and 305 may be doped at this time by e.g. ion implantation or plasma doping.

Figure 4:
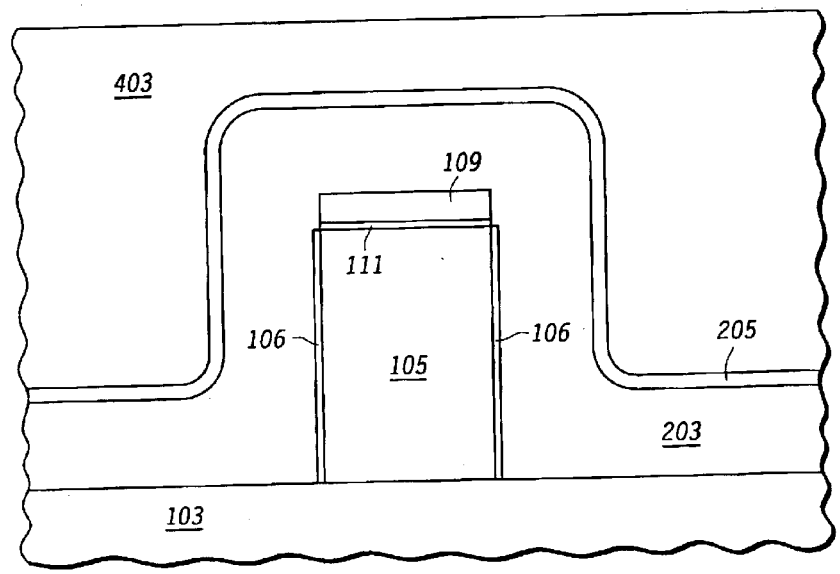
FIG. 4 is a partial side cross sectional view of one embodiment of a semiconductor wafer during another stage in the manufacture of a transistor according to the present invention.

FIG. 4 shows a partial cross sectional view of wafer 101 after a deposition of a planar layer 403 over wafer 101. In some embodiments, layer 403 may be made of e.g., photo resist, spin on glass, or organic antireflective coating material. Layer 403 may be formed by spin on techniques or by chemical vapor deposition techniques followed by chemical mechanical polish or reflow.

Figure 5:
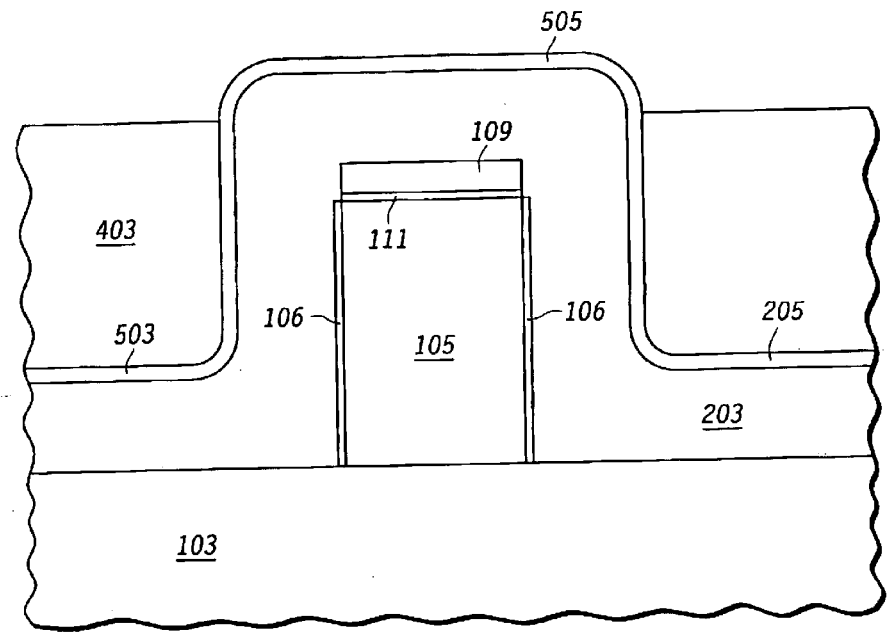
FIG. 5 is a partial side cross sectional view of one embodiment of a semiconductor wafer during another stage in the manufacture of a transistor according to the present invention.

FIG. 5 shows wafer 101 after layer 403 has been etched back to a level below the top of portion 505 of nitride layer 203 located over structure 104 to expose portion 505. In one embodiment, layer 403 may be etched back, e.g., by a conventional dry or wet etch techniques. In the embodiment shown, after the etch back, layer 403 is at least thick enough to cover portion 503 of layer 205 such that portion 505 of layer 205 may be removed by etched without removing portion 503.

In other embodiments, the resultant structure of layer 403 as shown in FIG. 5 may be formed by the planar deposition of the material of layer 403 to the level shown in FIG. 5, or other desired level.

Figure 6:
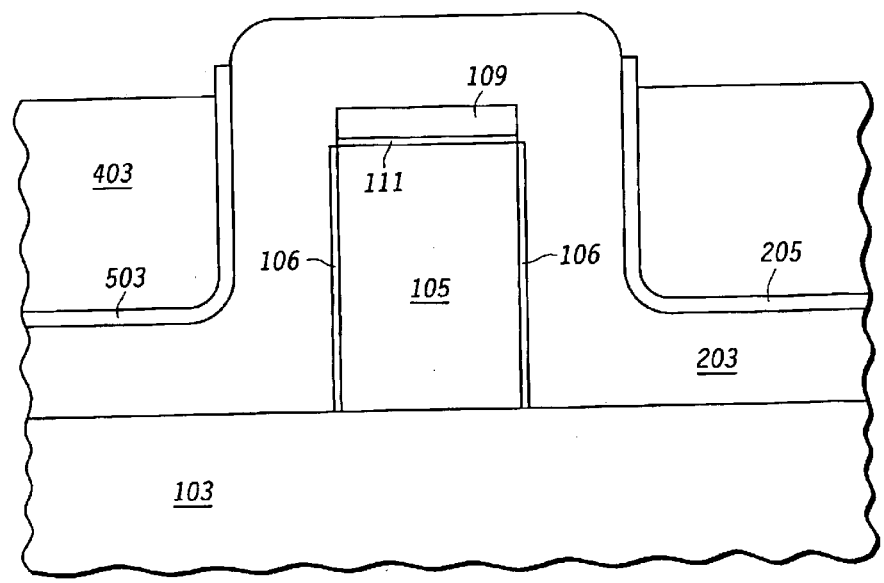
FIG. 6 is a partial side cross sectional view of one embodiment of a semiconductor wafer during another stage in the manufacturer of a transistor according to the present invention.

FIG. 6 shows the same view as FIG. 5 after portion 505 of nitride layer 205 located over structure 104 has been removed by etching. Layer 403, as shown in FIG. 6, protects portion 503 of layer 205 from being removing during the etching of portion 505.

Figure 7:
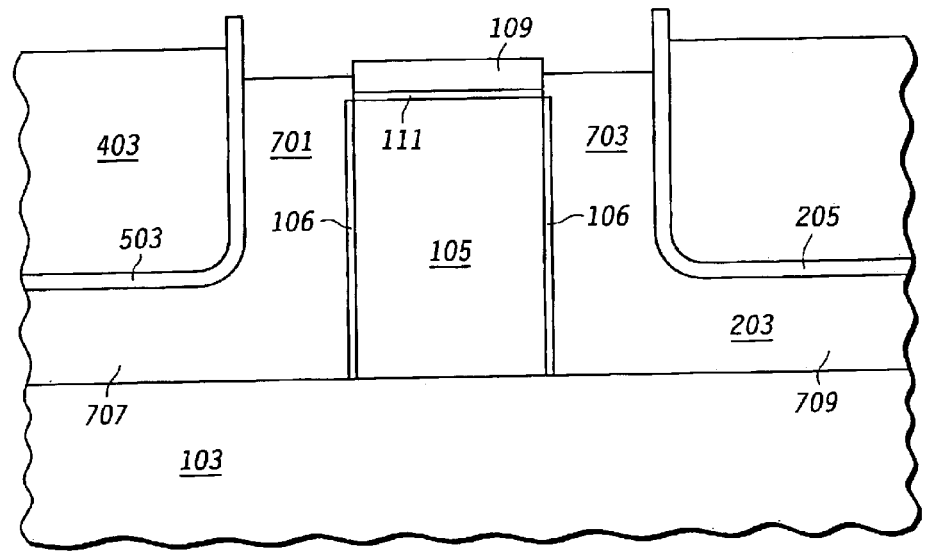
FIG. 7 is a partial side cross sectional view of one embodiment of a semiconductor wafer during another stage in the manufacture of a transistor according to the present invention.

Referring to FIG. 7, after portion 505 of layer 205 has been removed, the portion of layer 203 previously located under removed portion 505 of layer 205 is removed by a non abrasive etching (e.g. wet or dry) to form independent gate structures 701 and 703. Layer 403 (along with the remaining portions of layer 205) protects portions 707 and 709 of layer 203 from being removed during the etching of layer 203. Gate structures 701 and 703 each have a vertical portion located along a sidewall of structure 104.

Utilizing a planar layer for the formation of independent gate structures may allow a portion of the gate material to be removed to form separate gate structures for a transistor without extra masking steps. In some embodiments, the planar layer allows for the portion of the gate structure located over structure 104 to be removed without removing the portions of the gate structure used to form the independent gate structures. In some embodiments, because portions of the conformal layers including the gate material located over structure 104 are exposed from the planar layer, those portions can be removed e.g. by etching to isolate the gate structures without use of an extra mask step. Accordingly, alignment problems in forming separate gate previously described may be avoided.

Figure 8:
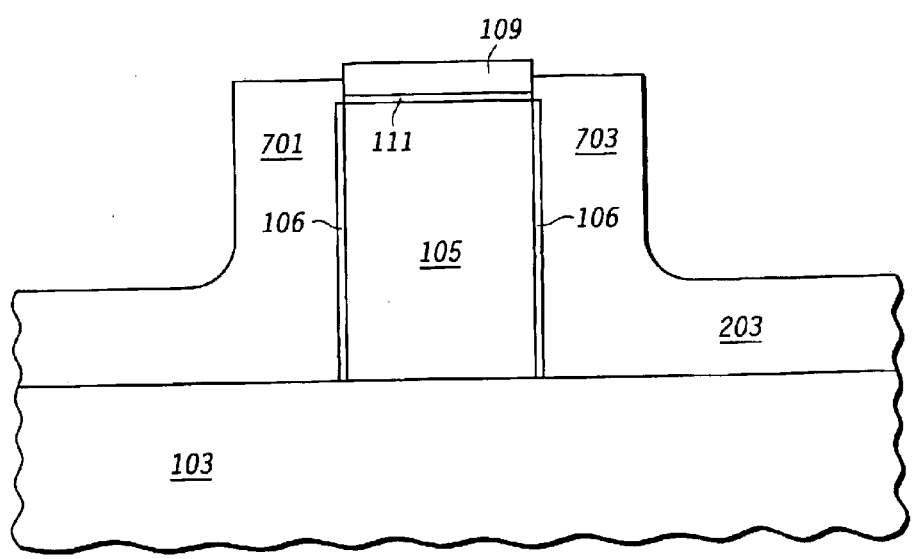
FIG. 8 is a partial side cross sectional view of one embodiment of a semiconductor wafer during another stage in the manufacture of a transistor according to the present invention.

FIG. 8 shows the same view as FIG. 7 after the removal of the remaining portions of layers 403 and 205. In some embodiments, these layers may be removed by wet or dry etches. In other embodiments, the remaining portions of layers 403 and 205 are not removed.

Figure 9:
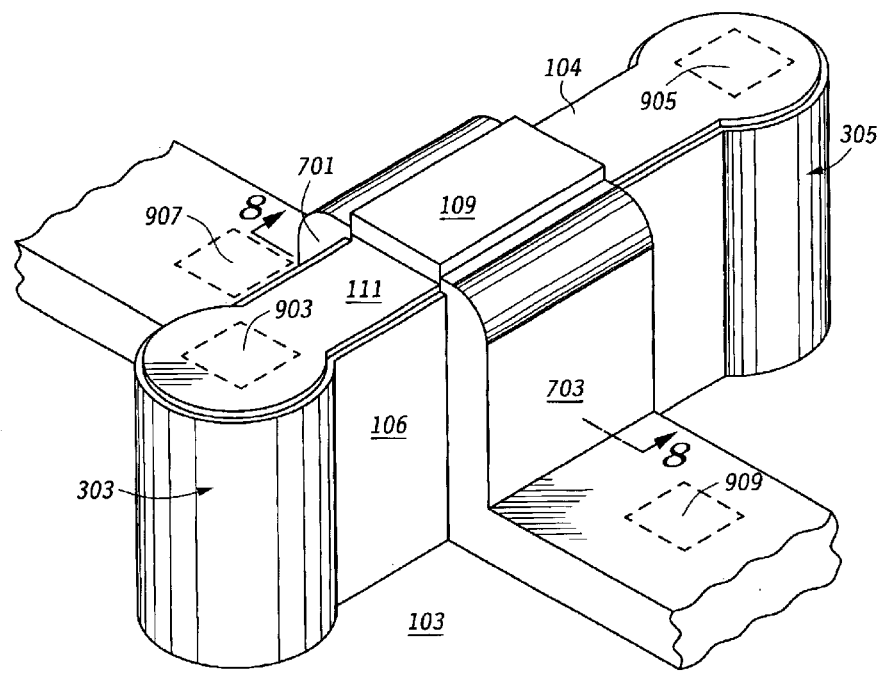
FIG. 9 is a partial isometric view of one embodiment of a semiconductor wafer during another stage in the manufacture of a transistor according to the present invention.

FIG. 9 shows an isometric view of the transistor shown in FIG. 8. In later processing stages, spacers and silicide layers of the transistor are formed by conventional semiconductor techniques. Regions 903 and 905 serve as current terminal contacts (e.g. as source/drain contacts for FETs). Also, regions 907 and 909 serve as gate contacts for gate structures 701 and 703, respectively.

Figure 10:
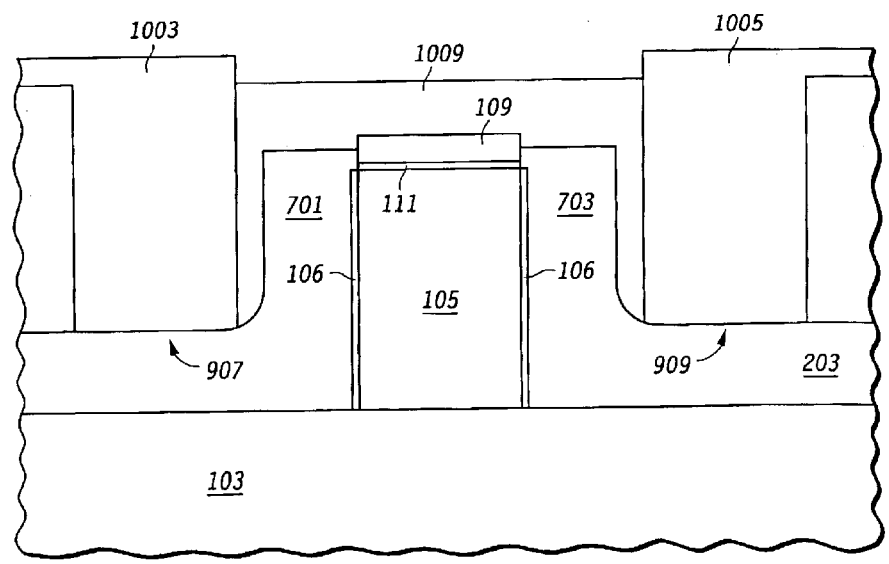
FIG. 10 is a partial side cross sectional view of one embodiment of a semiconductor wafer during another stage in the manufacture of a transistor according to the present invention.

FIG. 10 shows the same view as FIG. 8 after the formation gate was 1003 and 1005 over regions 907 and 909, respectively. A low K dielectric material 1009 is shown deposited over the resultant transistor structure. Other conventional processing stages not shown or described herein may be performed on wafer 101 to form other conventional structures (such as e.g. interconnects and passivation layers) of a semiconductor device. Afterwards, the wafer is singulated to separate the integrated circuits of the wafer.

Transistors with independent gate structures according to the present invention may be made by other processes. For example, the formation of the planar layer 403 and the removal of the portion of gate material (e.g. in layer 203) located over structure 104 may be performed after the formation of spacers and/or silicides as described above with respect to FIG. 10. Also, transistors with independent gate structures maybe made with out utilizing conformal nitride layer 205. With these embodiments, the planar layer 403 would be formed such that the top portion of the layer of gate material (e.g. 203) located over structure 104 would be expanded for etching.

In some embodiments, independent gate structures may be coupled together either by hardwiring (e.g. conductive material extending between the gate structures) or by other transistors which would allow for the gate structures to be selectively coupled together.

FIGS. 11–17 set forth views of a semiconductor wafer during various stages in the manufacture of another embodiment of a transistor with independent gate structures according to the present invention. The transistor formed also includes charge storage locations located between the gates and the channel region of the transistor. As will be described later, such a transistor may be utilized as a non volatile memory device for storing data in the charge storage locations.

Figure 11:
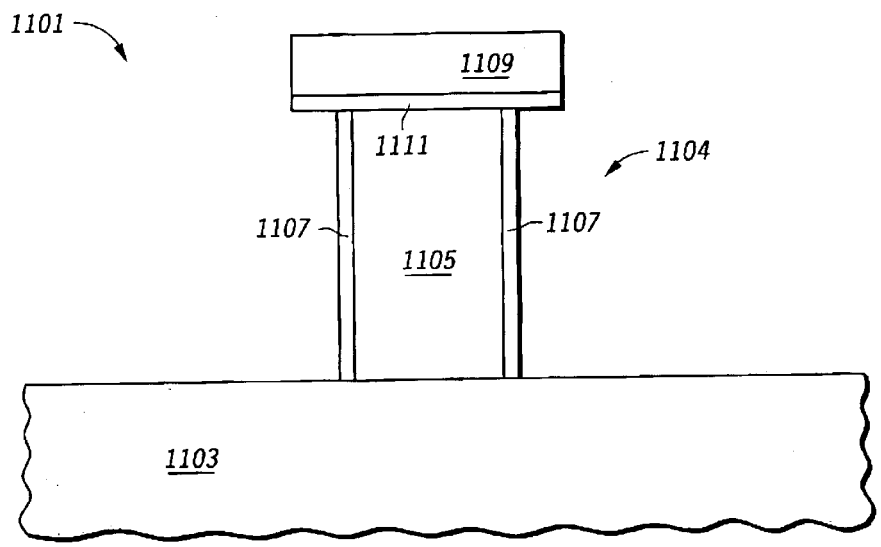
FIG. 11 is a partial side cross sectional view of another embodiment of a semiconductor wafer during a stage in the manufacture of a transistor according to the present invention.

Wafer 1101 includes a substrate having an insulating layer 1103. A structure 1104 has been formed over insulating layer 1103. In one embodiment, structure 1104 is a "fin" structure for a FinFET transistor having charge storage locations. Structure 1104 includes a semiconductor structure portion 1105 formed over the insulating layer 1103, a dielectric portion 1111 (e.g. silicon dioxide) formed over semiconductor structure portion 1105 and layer 1103, and a nitride portion 1109 located over portion 1111 and portion 1105. In one embodiment, structure 1104 is formed by depositing a layer of semiconductor material over layer 1103, forming a dielectric layer over the semiconductor material layer (e.g. by thermal oxidation of the semiconductor layer or by atomic layer deposition of a high K dielectric), and then depositing a layer of nitride over the dielectric. The semiconductor layer, the dielectric layer, and the nitride layer are then patterned to form a structure wherein the sidewalls of the semiconductor layer, the dielectric portion 1111, and nitride portion 1109 are flush with each other. In the embodiment shown, the remaining portion of the semiconductor layer is then trimmed (e.g. with a dry etch having an isotropic component) to recess the sidewalls of remaining semiconductor layer to form portion 1105 as shown in FIG. 11. In other embodiments, structure portion 1105 is not trimmed. In some embodiments, structure portion 1105 may be doped prior to the patterning of the layer of semiconductor material by conventional semiconductor processing techniques to provide the channel region of portion 105 with a specific conductivity type.

Afterwards, a dielectric layer 1107 is formed on the sidewalls of semiconductor structure portion 1105. As will be shown later, the channel region and current terminal regions are formed in portion 1105. In one embodiment, semiconductor structure portion 1105 is made of epitaxial silicon bonded on insulating layer 1103. In other embodiments, portion 1105 may be made of polysilicon or other semiconductor material. In one embodiment, structure 1104 is a fin structure of a FinFET.

Figure 12:
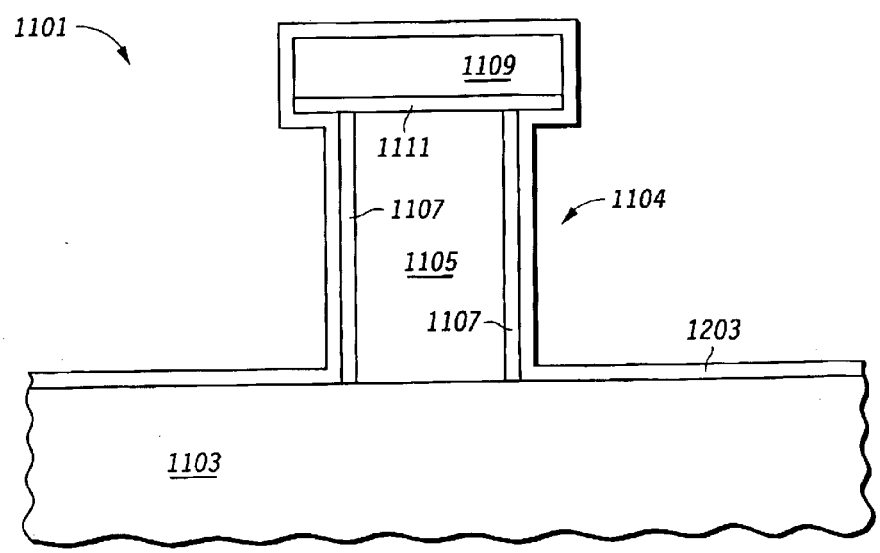
FIG. 12 is a partial side cross sectional view of another embodiment of a semiconductor wafer during another stage in the manufacture of a transistor according to the present invention.

Referring to FIG. 12, a layer 1203 of charge storage material is then deposited over wafer 1101 including structure 1104. In one embodiment, layer 1203 includes a layer of conductive material such as polysilicon (e.g. as with a floating gate transistor). In other embodiments, layer 1203 may include other types of charge storage material including material having a plurality of charge trapping elements (e.g. silicon nitride as with a thin film transistor). Still in other embodiments, layer 1203 may include discrete charge storage material (e.g. silicon nanocrystals embedded in a layer of dielectric). In some embodiments, the nanocrystals are 2–10 nm in diameter and have a density of $3-10e^{\wedge}11/^{\wedge}2$. In other embodiments, layer 1203 may be made of multiple layers such as e.g. a layer of silicon nanocrystals and a layer of silicon nitride deposited over the layer of silicon nanocrystals or a layer of silicon nanocrystals embedded between two layers of dielectric material.

Figure 13:
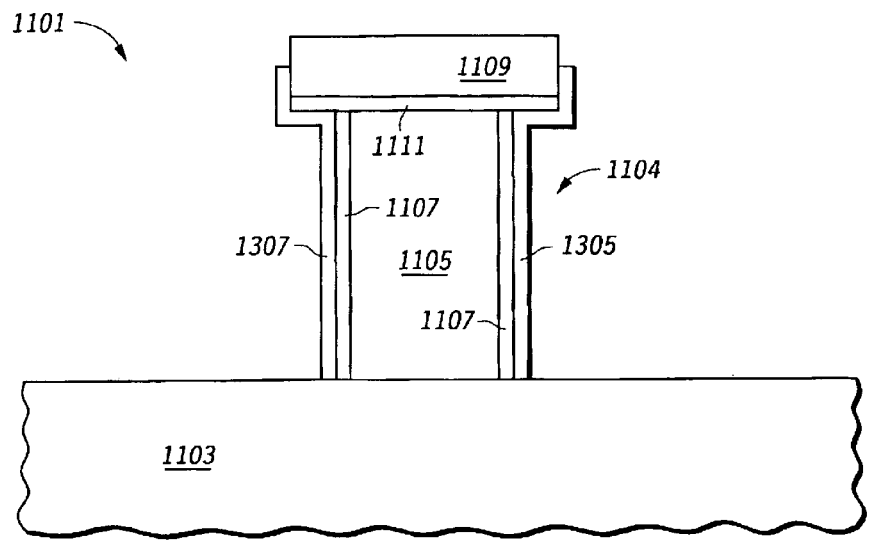
FIG. 13 is a partial side cross view of another embodiment of a semiconductor wafer during another stage in the manufacture of a transistor according to the present invention.

FIG. 13 shows a partial cross sectional view of wafer 1101 after layer 1203 has been etched to remove the portion of layer 1203 located over nitride portion 1109 and located on insulating layer 1103. Portions of layer 1203 remaining will later be etched to form isolated charge storages structures 1307 and 1305 located on the opposite sidewalls of structure 1104. In one embodiment, layer 1203 is etched with anisotropic dry etch to form storage structures 1307 and 1305. In some embodiments, where the charge storage material is made of a high resistivity material such that there would be little to no leakage current, layer 1203 is not etched. In such embodiments, the charge storage structures having charge storage locations would be part of a contiguous layer 1203.

Figure 14:
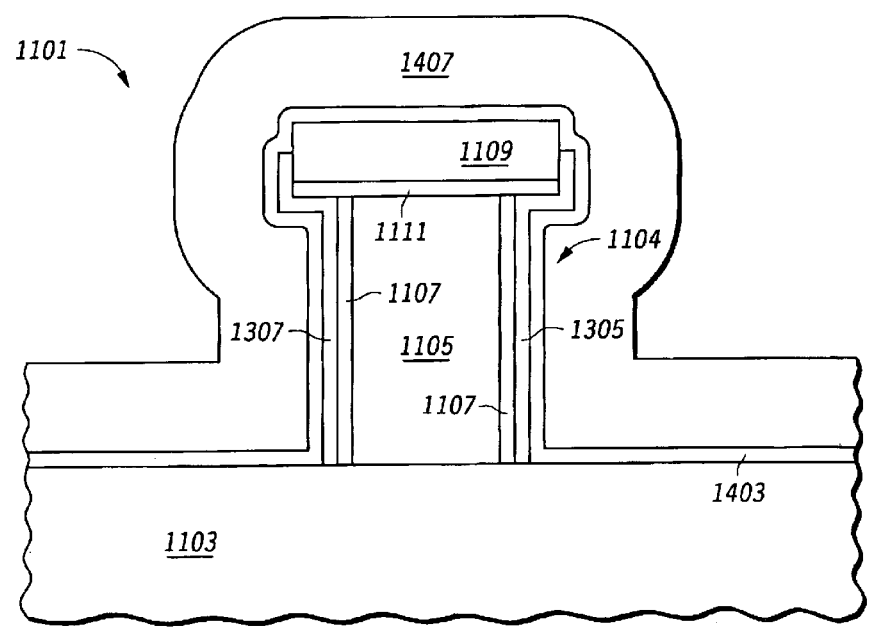
FIG. 14 is a partial side cross sectional view of another embodiment of a semiconductor wafer during another stage in the manufacture of a transistor according to the present invention.

FIG. 14 shows a partial cross sectional view of wafer 1101 after a conformal layer 1403 of control dielectric has been deposited over wafer 1101 and after a conformal layer 1407 of gate material has been deposited over layer 1403.

After the deposition of gate material layer 1407, the wafer is further processed to form to two gate structures as per a similar process describe above with respect to FIGS. 2–8. For example, a nitride layer (not shown), similar to nitride layer 205 in FIG. 2, is deposited over layer 1407. The nitride layer and layer 1407 is then patterned to form a gate structure similar to gate structure 301 shown in FIG. 3. In some embodiments, a portion of charge storage layer 1203 located on the side of dielectric layer 1107 and not underneath the gate structure is etched after the layer 1407 has been etched. After the formation of a gate structure, a planar layer (similar to layer 403 in FIG. 5) is formed wherein the portion of the nitride layer located above structure 1104 is exposed (See FIG. 5 and the text discussing thereof). After the removal of the exposed portion of the nitride layer, the gate material located above structure 1104 is then etched to form gate structures 1505 and 1503 (See FIG. 15) in a manner similar to that set forth in FIGS. 6–8 and the discussion thereof.

Figure 15:
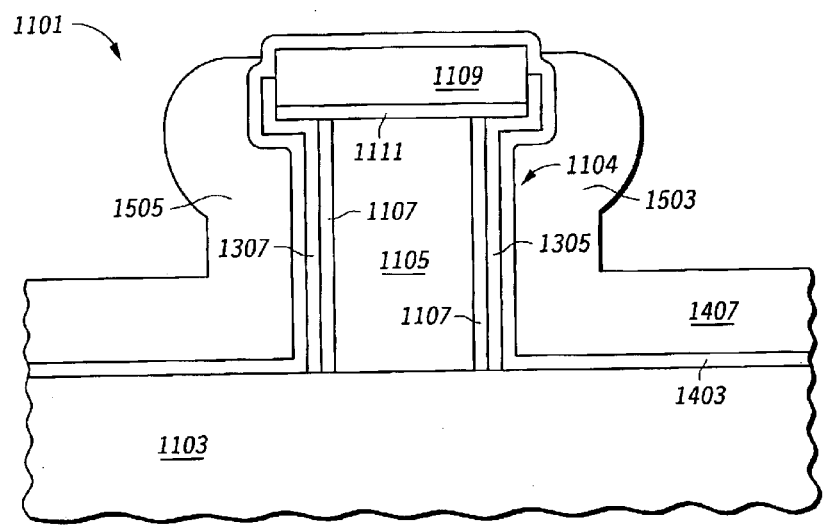
FIG. 15 is a partial side cross sectional view of another embodiment of a semiconductor wafer during another stage in the manufacture of a transistor according to the present invention.
Figure 16:
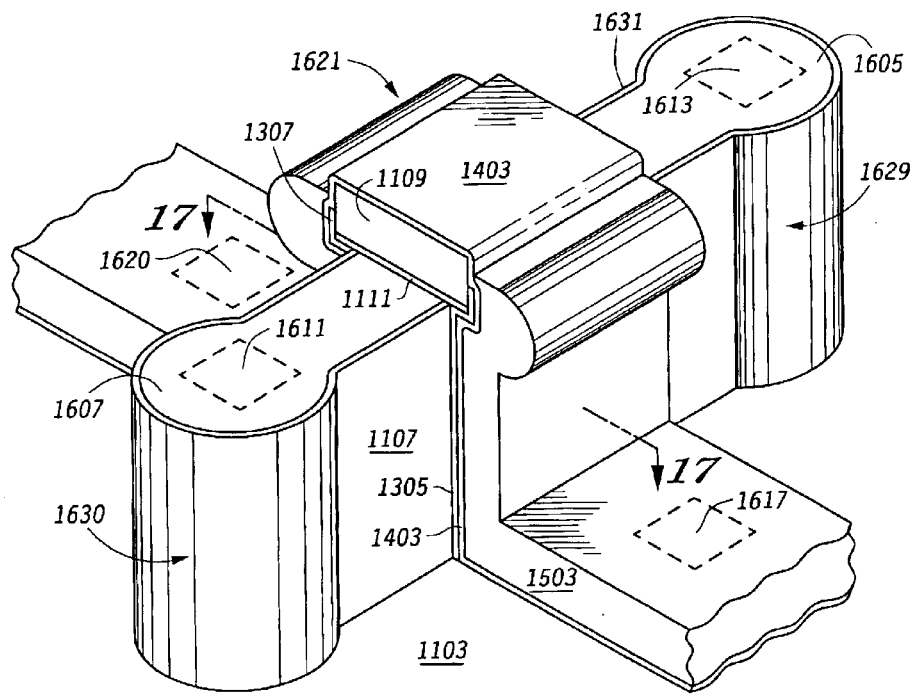
FIG. 16 is a partial isometric view of another embodiment of a semiconductor wafer during another stage in the manufacture of a transistor according to the present invention.

FIG. 15 shows a partial side view of water 1101 after the formation of gate structures 1505 and 1503. FIG. 16 is a partial isometric view of the transistor structure shown in FIG. 15. Regions 1607 and 1605 serve as current terminal regions with 1611 and 1613 serving as current terminal contacts (e.g. as source/drain contacts for FETs) for those regions. Also, regions 1620 and 1617 serves as gate contacts for gate structures, 1505 and 1503 respectively.

In some embodiments, gate structures 1503 and 1505 are doped. The material of these gate structures is doped, in one embodiment, prior to the deposition of the nitride layer (e.g. 205) over the layer of gate material. Also, in some embodiments, the current terminal regions 1607 and 1605 are doped after the formation of gate structures 1505 and 1503 to provide a conductivity type that is different from the conductivity type of the channel region of semiconductor structure portion 1105.

In later processing stages, silicide layers, spacers, gate vias, and current terminal vias and are formed over transistor structure 1621 by conventional semiconductor techniques. A low K dielectric material (e.g. 1009) may also deposited over the resultant transistor structure 1621. Other conventional processing stages not shown or described herein may be performed on wafer 1101 to form other conventional structures (such as e.g. interconnects and passivation layers) of an integrated circuit.

The resultant transistor structure 1621 shown in FIG. 16 can be utilized as a non volatile memory cell having four isolated charge storage locations (two each in charge storage structure 1305 and 1307, respectively) that can each store one of bit of data.

Figure 17:
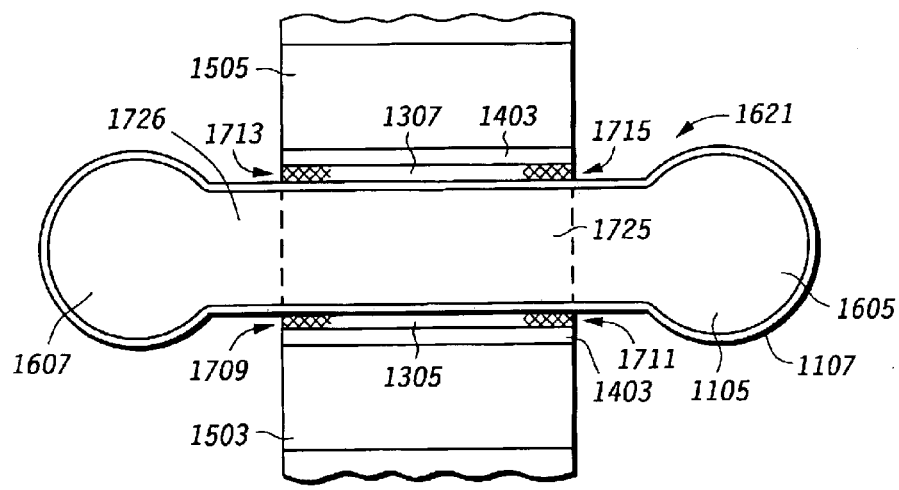
FIG. 17 is a partial cut away top view of another embodiment of a transistor according to the present invention.

FIG. 17 is a partial cutaway top view of transistor structure 1621 shown in FIG. 16. Charge storage structure 1305 includes two charge storage locations 1709 and 1711, and charge structure 1307 includes two charge storage locations 1713 and 1715. These four charge storage locations may be programmed, read, and or erased by applying voltages to current terminal regions 1605 and 1607 and gate structures 1503 and 1505.

In one embodiment, the transistor structure 1621 functions as two functional MOSFET transistors that share source/drain regions and each have two charge storage locations. Gate structure 1503 serves as the gate for one of the functional transistors, and gate structure 1505 serves as the gate of the other functional transistors. Charge storage locations 1709 and 1711 serve as charge storage locations for the functional transistor having gate structure 1503 as its gate. Charge storage locations 1713 and 1715 server as charge storage locations for the functional transistor having gate structure 1505 as its gate.

In the embodiment shown, semiconductor structure portion 1105 includes a channel region 1725 (approximately differentiated by the dashed lines) located between current terminal regions 1605 and 1607. Channel region 1725 is doped to provide a first conductivity type and current terminal regions 1605 and 1607 are doped to provide a second conductivity type.

During the operation of transistor structure 1621, when a voltage is applied to gate structure 1503 that exceeds a voltage threshold of the functional transistor associated with gate structure 1503, an inversion region forms along the sidewall of the channel region 1725 adjacent to gate structure 1503. When a voltage is applied to gate structure 1505 that exceeds a voltage threshold of the functional transistor associated with that gate structure, an invention layer forms along the sidewall of channel region 1725 adjacent to gate structure 1505. In some embodiments where portion 1105 is relatively thin between gate structures 1503 and 1505, the regions where the inversion layers occur may overlap.

Charge may be injected into each of the charge storage location (e.g. by hot carrier injection) to increase the threshold voltage of the functional transistor associated with that charge storage location. For example, to store a charge in charge storage location 1709, a positive voltage (Vpp) is applied to gate structure 1503, ½ Vpp is applied to current terminal region 1605, and a ground potential is applied to current terminal region 1607 and gate structure 1505.

Each of the charge storage locations may be read independently of each other. Application of a positive voltage (Vdd) to the gate structure adjacent to a charge storage location and a positive voltage (Vdd) to the current terminal on the opposite side of the charge storage location will effectively read the charge stored in the charge storage location without being affected by the charge stored in the other charge storage locations. For example, to read charge storage location 1709, a positive charge is applied to gate structure 1503 and to current terminal region 1607, with a ground potential (VSS) being applied to gate structure 1505 and current terminal region 1605. The voltage applied to current terminal region 1607 is sufficiently positive so that it effectively masks or shadows any charge present in charge storage location 1711. In this way, the current through the channel region is primarily affected by the charge stored in location 1709 and not by the charge stored in any other charge storage location.

To erase a charge stored in charge storage location, a hot hole injection technique may be utilized. For example, to erase the charges stored in charge storage location 1709, a negative voltage (−Vpp) is applied to gate structure 1053 and a positive voltage (Vpp) is applied to current terminal region 1605, the current terminal adjacent to charge storage location 1709. A ground potential (Vss) is applied to current terminal region 1605 and gate structure 1505.

In another embodiment, the charge storage locations of structure 1621 may be erased at the same time by applying a negative voltage (−Vpp) to gate structures 1503 and 1505 and a positive voltage (Vpp) to current terminal regions 1605 and 1607.

In other embodiments, other program, read, and/or erase techniques may be utilized for programming, reading and/or erasing the charge in the charge storage location of transistor structure 1621. For example other conventional techniques for reading a non volatile memory cells having two storage locations may be used.

In other embodiments, transistor structure 1621 may be utilized such that it implements only two charge storage locations. In one such embodiment, the first charge storage location is located in charge storage structure 1305 and the second charge storage location is located in charge storage structure 1307. With these embodiments, transistor structure 1621 is utilized as two functional transistors with each functional transistor including a charge storage location. In one example of such an embodiment, the charge storage layer would be made of conducting material (e.g. polysilicon) e.g. as with a floating gate transistor.

In other embodiments having only two charge storage locations, each charge storage structure (1305 and 1307) would independently be able to store a charge, but transistor structure 1621 would be read as a single functional transistor having 4 voltate threshold levels. The voltage threshold would be a function of the charge stored in both the charge storage structures. In this embodiment, the charge storage structures would be programmed with different voltages applied to the gates structures. The transistor structure would be read with a single voltage applied to both gate structures. In some of these embodiments, the gate structures would be preferably of different conductivity types or would have different work functions.

In other embodiments, a transistor structure having gate structures adjacent to the sidewalls of the channel region may have other configurations. For example, the width, length, and/or height of the channel region 1725 may be of other dimensions. Also in other embodiments, multiple transistor structures may be linked together wherein each transistor structure shares a current terminal region (e.g. 1607) with the adjacent transistor structure. The channel regions (e.g. 1725) and the gate structures (e.g. 1503 and 1505) would be located between the shared current terminal regions (e.g. 1607 and 1605). An example of such an implementation may be represented by the array shown in FIG. 18 wherein the current terminal region of one transistor structure is serves as the current terminal of another transistor structure. For example, referring to FIG. 16, a second intermediate structure (not shown) would extend from end structure 1630 in the opposite direction (to the left relative to the view shown in FIG. 17) as intermediate structure 1631 of structure 1104 extends from end structure 1630. A third intermediate structure (not shown) would extend from end structure 1629 in the opposite direction (to the right relative to the view shown in FIG. 17) as intermediate structure 1631 extends from end structure 1629. A pair of gate structures similar to gate structures 1503 and 1505 would be adjacent to each sidewall of the second intermediate structure and third intermediate structure, similar to the position of gate structures 1503 and 1505 with respect to intermediate structure 1631.

In other embodiments, the gate structures 1503 and 1505 may have different conductivity types. This may be accomplished in one embodiment by angled implantation of different dopant species. For example gate structure 1505 may be implanted with a P+ dopant and gate structure 1503 may be implanted with an N+ dopant.

Figure 18:
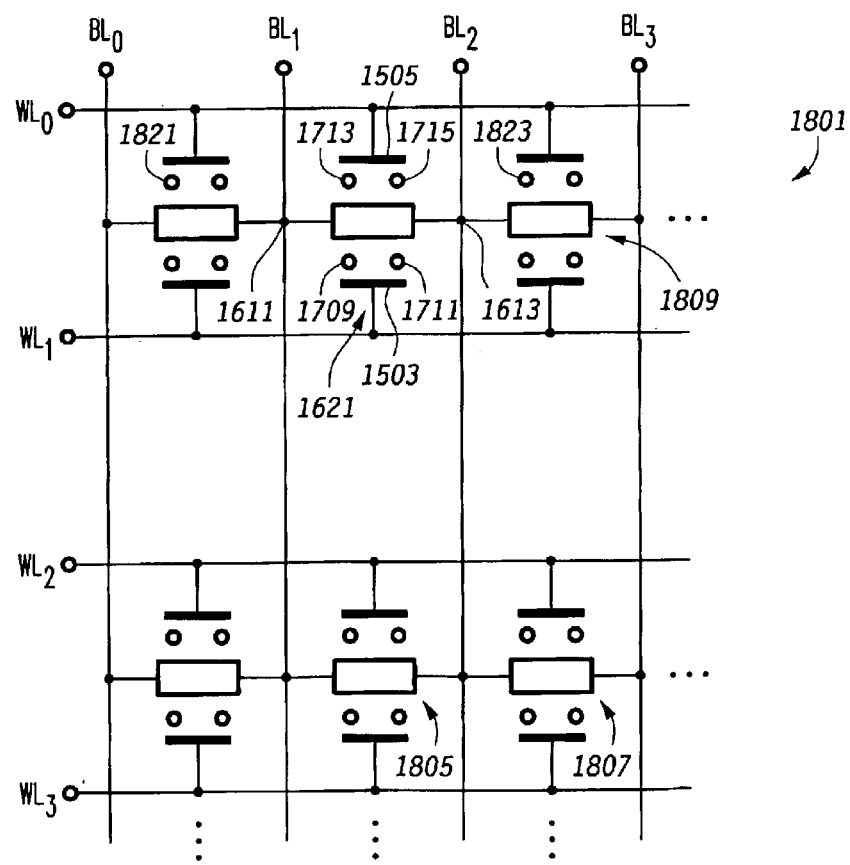
FIG. 18 is a schematic of one embodiment of a memory array according to the present invention.

FIG. 18 is a circuit diagram of a non volatile memory array implementing the transistor structure 1621 as a memory cell including four storage locations (1713, 1709, 1715, and 1711). In one embodiment, array 1801 a non volatile memory array of an integrated circuit device. Array 1801 includes a member of memory cells with each cell (e.g. 1809, 1805, 1807) implementing a transistor structure similar to transistor structure 1621. Each cell includes for storage locations similar to storage locations 1713, 1709, 1715, and 1711.

The gate structures (e.g. 1505 and 1503) of each cell are coupled to a word line. For example, gate structure 1505 is couple to word line WL0 and gate structure 1503 is coupled to word line WL1. Each current terminal region of a memory cell is coupled to a bitline. For example, terminal contact 1611 of terminal region is coupled to bitline BL1 and current terminal contact 1613 is coupled to bitline BL2. The bitlines (BL0, BL1, BL2, and BL3) and the word lines (WL0, WL1, WL2, and WL3) of array 1801 are couple to conventional memory array control circuitry (not shown) for controlling the voltages of the lines. The memory cells are arranged in array 1801 in rows and columns. In the embodiment shown, cells 1809 and the cell of transistor structure 1621 are in the same row, and cells 1809 and 1807 are in the same column.

FIG. 19 sets forth the voltages applied to the bitlines and word lines shown in FIG. 18 for programming, erasing, and reading storage location 1713. In one embodiment, Vpp=8.0 V, Vss=0, and Vdd=4.0. To read storage location 1713, BL1 is coupled to a sense amplifier (not shown), as designated by "SA" in the table of FIG. 19, to determine whether the transistor has been turned on or not. Whether a transistor has been turned on or not is dependent upon whether a charge is stored at the charge storage location (e.g. 1713) being read. To program location 1713, a voltage of VPP/2 is applied to bitline BL1 and all bitlines located before BL1 (e.g. BL0) so that locations having a gate coupled to word line WL0 located before bitline BL1 (e.g. charge storage location 1821) are not programmed. A ground voltage VSS is applied to all bitlines located after BL1 (e.g. BL2 and BL3) so that no charge storage locations located after bitline BL2 (e.g. 1823) are inadvertently programmed.

In other embodiments, the charge storage locations of array 1801 may be erased in a block erase function. In these embodiments, a positive voltage is applied to all bitlines and a negative voltage is applied to all word lines.

FIG. 20 sets forth voltages applied to the bitlines and word lines shown in FIG. 18 for programming, erasing, and reading storage location 1711.

As shown in the tables of FIGS. 19 and 20, the gate of a cell opposite of the charge storage location being programmed, erased, or read is biased at ground (VSS) during these operations. For example, gate structure 1503, which is opposite of charge storage location 1713, is biased at VSS during program, erase, and read operations of location 1713.

FIGS. 21 and 22 set forth voltages that are applied to the bitlines and word lines of array 1801 in another embodiment for programming, erasing, and reading the charge storage locations of 1801. In this embodiment, the opposing gate to the charge storage location of a cell being programmed is biased at the opposite voltage of the gate of the cell associated with that location. For example, referring to FIG. 21, to program location 1713, a positive voltage VPP is applied to the word line (WL0), which is coupled to gate structure 1505 and is associated with charge storage location 1713, and −VPP is applied to word line WL1, which is coupled gate structure 1503 and is opposite to charge storage location 1713. In this embodiment, the width and conductivity of the channel regions of the transistor structures are such that the potential of the channel region adjacent to a gate structure is influenced by the opposing gate structure.

Because a negative program voltage can be applied to the opposing gate of a charge storage location being programmed, the voltage applied to the gate associated with the cell being programmed may be reduced accordingly. For example, in one embodiment, VPP may be 6.0 volts. Accordingly, because this embodiment allows for a reduction in the program voltage, lower programming voltages may be utilized. In some embodiments, reducing the programming voltage may allow for a reduction in the area required for circuitry to provide the program voltage.

Another advantage that may occur from using a transistor with gate structures adjacent to opposing sidewalls in a memory array is that the opposite gate of a charge storage location can provide a transistor such as e.g. a FinFET with a voltage control circuit that effectively acts like as a well voltage control circuit for a planar CMOS transistor. However, unlike the well voltage control circuit for planar CMOS transistors, the voltage of the opposing gate can be controlled independently of gates in other rows of the array. This may allow for the use of more advanced program and erase techniques for an array than would be possible with other types of charge storage transistors.

One advantage that may occur with the array shown in FIG. 18 is that more charge storage locations may be implemented in a given area than with planar CMOS NVM cells. Furthermore, with the array of FIG. 18, because 4 independent storage locations are programmable utilizing just two current terminal contacts, the transistors may be more closely placed in an array. In some embodiments, a transistor structure similar to transistor structure 1621 may be easily implemented in an integrated circuit having devices implementing FinFET technology or other types of silicon on insulator technology.

In another embodiments, transistor structure 1261 may be modified to have only one charge storage structure between a gate and the sidewall of the channel region. With one embodiment of such a transistor, the opposing sidewall would not have a charge storage structure between it and the opposing gate. The opposing gate would serve as an effective well bias voltage control circuit.

Furthermore, transistor structures such as those described above may be implemented in memory arrays having other configurations. Also in other embodiments, a memory cell having two independent gate structures adjacent to opposing sidewalls of a semiconductor structure and having charge storage locations located between the gate structures and the sidewalls maybe made by other semiconductor processes other than that set forth in this specification, including other conventional processes for forming independent gate structures.

In one aspect of the invention, a memory device includes a substrate and a semiconductor structure over the substrate. The semiconductor structure includes a channel region between a first current region and a second current region. The semiconductor structure has a first sidewall and a second sidewall. The second sidewall opposes the first sidewall. The memory device also includes a gate structure adjacent to the first sidewall. The channel region includes a portion located along the first sidewall adjacent to the gate structure. The memory device further includes a charge storage location including at least a portion located between the first sidewall and the gate structure.

In another aspect of the invention, a memory includes a plurality of memory cells each having a first gate structure, a second gate structure, first doped region, a second doped region, and a channel region adjacent to the first gate structure and the second gate structure and between the first doped region and the second doped region. Each of the plurality of memory cells includes four storage locations. The memory includes a first row of the plurality of memory cells having the first gate structure coupled to a first word line and the second gate structure coupled to a second word line. The memory also includes a second row of the plurality of memory cells having the first gate structure coupled to a third word line and the second gate structure coupled to a fourth word line. The memory further includes a first column of the plurality of memory cells that includes a first portion of the first row and the second row, having the first doped region coupled to a first bit line and the second doped region coupled to a second bit line. The memory still further includes a second column of the plurality of memory cells that includes a second portion of the first row and the second row, having the first doped region coupled to the second bit line and the second doped region coupled to a third bit line.

In other aspect of the invention, a method of making a semiconductor device includes providing a substrate and providing a semiconductor structure over the substrate. The semiconductor structure has a first sidewall, a second sidewall, and a top surface. The method also includes forming a first region in the semiconductor structure being of a first conductivity type, forming a second region in the semiconductor structure being of the first conductivity type, and forming a channel region in the semiconductor structure between the first region and the second region being of a second conductivity type. The method further includes forming a first gate structure adjacent to the first sidewall and forming a first charge storage location including at least a portion located between the first sidewall and the first gate structure.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory device, comprising:

a substrate;

a semiconductor structure over the substrate, the semiconductor structure including a channel region between a first current region and a second current region, the semiconductor structure having a first sidewall and a second sidewall, the second sidewall opposing the first sidewall;

a gate structure adjacent to the first sidewall, the channel region including a portion located along the first sidewall adjacent to the gate structure; and a charge storage location including at least a portion located between the first sidewall and the gate structure;

wherein there exists a plane parallel to the substrate, wherein a portion of the first current region, a portion of the second current region, and a portion of the channel region reside in the plane.

2. The memory device of claim 1, wherein the charge storage location is implemented in a layer of conductive material.

3. The memory device of claim 2 wherein the layer of conductive material includes polysilicon.

4. The memory device of claim 1, wherein the charge storage location is implemented in a layer of material comprising a plurality of charge trapping elements.

5. The memory device of claim 4 wherein the layer of material comprising a plurality of charge trapping elements includes silicon nitride.

6. The memory device of claim 1 wherein the direction of current in the channel region is generally parallel to the substrate.

7. The memory device of claim 1 wherein a length of the channel region is defined by photolithographic techniques.

8. The memory device of claim 1, further comprising:

a second gate structure adjacent to the second sidewall, wherein the channel region including a portion located along the second sidewall adjacent to the second gate structure.

9. The memory device of claim 8 further comprising:

a second charge storage location including at least a portion located between the second gate structure and the second sidewall.

10. The memory device of claim 9 further comprising:

a third charge storage location including at least a portion located between the gate structure and the first sidewall;

a fourth charge storage location including at least a portion located between the second gate structure and the second sidewall.

11. The memory device of claim 10 further comprising:

a first charge storage structure including charge storage material, at least a portion of the first charge storage structure is located between the gate structure and the first sidewall, the charge storage location and the third charge storage location being implemented in the first charge storage structure;

a second charge storage structure including charge storage material, at least a portion of the second charge storage structure is located between the second gate structure and the second sidewall, the second charge storage location and the fourth charge storage location being implemented in the second charge storage structure.

12. The memory device of claim 11, further comprising:
a first control dielectric between the first charge storage structure and the gate structure; and
a second control dielectric between the second charge storage structure and the second gate structure.

13. The memory device of claim 11 wherein the first charge storage structure and the second charge storage structure each reside in a contiguous layer including charge storage material.

14. A memory array including the memory device of claim 9, the memory array further comprising:
a first word line coupled to the gate structure;
a second word line coupled to the second gate structure;
wherein a first voltage is applied to the first word line and a second voltage is applied to the second word line to read the charge storage location;
wherein the second voltage is applied to the first word line and the first voltage is applied to the second word line to read the second charge storage location.

15. The memory device of claim 1 wherein the charge storage location is implemented in a structure including charge storage material between the gate structure and the first sidewall.

16. The memory device of claim 1 further comprising:
a first dielectric layer on the first sidewall, the charge storage location is implemented on a structure located on the first dielectric layer.

17. The memory device of claim 1 wherein:
the first current region is of a first conductivity type;
the second current region is of the first conductivity type;
the channel region is of a second conductivity type.

18. The memory device of claim 1 wherein the first current region has a first contact and the second current region has a second contact.

19. The memory device of claim 1 wherein:
the substrate further comprises an insulating layer;
the semiconductor structure is located above the insulating layer.

20. The memory device of claim 1 further comprising:
a dielectric structure located over a top surface of a portion of the semiconductor structure, the portion of the semiconductor structure including a portion adjacent to the gate structure.

21. The memory device of claim 1 wherein the semiconductor structure includes a semiconductor fin, wherein the first current region, the second current region, and the channel region are implemented in the fin.

22. The memory device of claim 1 wherein a portion of the gate structure resides in the plane.

23. The memory device of claim 1 wherein a portion of the charge storage location resides in the plane.

24. A memory device comprising:
a substrate;
a semiconductor structure over the substrate, the semiconductor structure including a channel region between a first current region and a second current region, the semiconductor structure having a first sidewall and a second sidewall, the second sidewall opposing the first sidewall;
a gate structure adjacent to the first sidewall, the channel region including a portion located along the first sidewall adjacent to the gate structure; and
a charge storage location including at least a portion located between the first sidewall and the gate structure;
wherein the charge storage location is implemented in a structure comprising discrete charge storage material.

25. The memory device of claim 24, wherein the charge storage location is implemented in a structure embedded with silicon nanocrystals.

26. A memory, comprising:
a plurality of memory cells each having a first gate structure, a second gate structure, a first doped region, a second doped region, and a channel region adjacent to the first gate structure and the second gate structure and between the first doped region and the second doped region, wherein each of the plurality of memory cells comprises four storage locations;
a first row of the plurality of memory cells having the first gate structure coupled to a first word line and the second gate structure coupled to a second word line;
a second row of the plurality of memory cells having the first gate structure coupled to a third word line and the second gate structure coupled to a fourth word line;
a first column of the plurality of memory cells including a first portion of the first row and the second row, having the first doped region coupled to a first bit line and the second doped region coupled to a second bit line; and
a second column of the plurality of memory cells including a second portion of the first row and the second row, having the first doped region coupled to the second bit line and the second doped region coupled to a third bit line;
wherein each channel region resides in a semiconductor structure over a substrate, the semiconductor structure has a first sidewall and a second sidewall, the first gate structure is located adjacent to the first sidewall and the second gate structure is located adjacent to the second sidewall;
each memory cell has a first storage structure including at least a portion located between and adjacent to the first gate structure and the first sidewall and a second storage structure including at least a portion located between and adjacent to the second gate structure and the second sidewall; and
the first storage structure has two charge storage locations and the second storage structure has two charge storage locations.

27. The memory of claim 26, wherein each memory cell further comprises a first gate dielectric between the first sidewall and the first storage structure and a second gate dielectric between the second sidewall and the second storage structure.

28. The memory of claim 26, wherein each memory cell further comprises a first control dielectric between the first gate structure and the first storage structure and a second control dielectric between the second gate structure and the second storage structure.

29. The memory of claim 26, wherein:
the first storage structure includes a first charge storage location nearer the first doped region and a second charge location nearer the second doped region; and
the second storage structure comprise a third charge storage location nearer the first doped region and fourth charge storage location nearer the second doped region.

30. The memory of claim 26, wherein the channel region of each memory cell is implemented in a semiconductor fin.

31. The memory of claim 26, wherein the first gate structure of each cell comprises polysilicon doped to a first conductivity type and the second gate structure of each cell comprises polysilicon doped to a second conductivity type.

32. A method of programming a first charge storage location of a memory cell of the memory of claim 26 that is in both the first row and the first column, comprising:
applying a first positive voltage to the first word line, a first negative voltage to the second word line, the first negative voltage to the second bit line, a second negative voltage that is less negative than the first negative voltage to the first bit line, a voltage not greater than ground to the third and fourth word lines, and the first negative voltage to the third bit line.

33. A method of erasing the first storage location of a memory cell of the memory of claim 26 that is in both the first row and first column, comprising:
applying a first negative voltage to the first word line, a first positive voltage to the first bit line; and a voltage not greater than ground potential to the second and third bit lines and the second, third, and fourth word lines.

34. A method of making a semiconductor device, comprising:
providing a substrate;
providing a semiconductor structure over the substrate, the semiconductor structure having a first sidewall, a second sidewall, and a top surface;
forming a first region in the semiconductor structure being of a first conductivity type;
forming a second region in the semiconductor structure being of the first conductivity type;
forming a channel region in the semiconductor structure, the channel region being located between the first region and the second region and being of a second conductivity type,
forming a first gate structure adjacent to the first sidewall; and
forming a first charge storage location including at least a portion located between the first sidewall and the final gate structure;
wherein there exists a plane parallel to the substrate, wherein a portion of the first region, a portion of the second region, and a portion of the channel region reside in the plane.

35. The method of claim 34 further comprising:
forming a second gate structure adjacent to the second sidewall; and
forming a second charge storage located including at least a portion located between the second gate structure and the second.

36. A memory device, comprising:
a substrate;
a semiconductor structure over the substrate, the semiconductor structure including a channel region between a first current region and a second current region, the semiconductor structure having a first sidewall and a second sidewall, the second sidewall opposing the first sidewall;
a first gate structure adjacent to the first sidewall, the channel region including a portion located along the first sidewall adjacent to the first gate structure; and a charge storage location including at least a portion located between the first sidewall and the first gate structure;
a second gate structure adjacent to the second sidewall, wherein the channel region including a portion located along the second sidewall adjacent to the second gate structure;
wherein when a voltage applied to the first gate structure exceeds a voltage threshold of a functional transistor associated with the first gate structure, a first inversion region forms along the first sidewall in the channel region adjacent to the first gate structure;
wherein when a voltage applied to the second gate structure exceeds a voltage threshold of a functional transistor associated with the second gate structure, a second inversion region forms along the second sidewall in the channel region adjacent to the second gate structure.

37. A method of making a semiconductor device, comprising:
providing a substrate;
providing a semiconductor structure over the substrate, the semiconductor structure having a first sidewall, a second sidewall, and a top surface;
forming a first region in the semiconductor structure being of a first conductivity type;
forming a second region in the semiconductor structure being of the first conductivity type;
forming a channel region in the semiconductor structure, the channel region being located between the first region and the second region and being of a second conductivity type,
forming a first gate structure adjacent to the first sidewall; and
forming a first charge storage location including at least a portion located between the first sidewall and the first gate structure;
forming a first current terminal contact at the top surface of the semiconductor structure in the first region;
forming a second current terminal contact at the top surface of the semiconductor structure in the second region.

38. A memory device, comprising:
a substrate;
a semiconductor structure over the substrate, the semiconductor structure including a channel region between a first current region and a second current region, the semiconductor structure having a first sidewall and a second sidewall, the second sidewall opposing the first sidewall;
a gate structure adjacent to the first sidewall, the channel region including a portion located along the first sidewall adjacent to the gate structure; and
a first charge storage location including at least a portion located between and adjacent to the first sidewall and the gate structure;
a second charge storage location including at least a portion located between and adjacent to the first sidewall and the gate structure.

* * * * *

UNITED STATES PATENT AND TRADEMARK OFFICE
CERTIFICATE OF CORRECTION

PATENT NO. : 6,903,967 B2  Page 1 of 1
APPLICATION NO. : 10/443908
DATED : June 7, 2005
INVENTOR(S) : Leo Mathew It is certified that error appears in the above-identified patent and that said Letters Patent is hereby corrected as shown below:

Column 15, Line 51, Claim No. 35:

Change "located" to --location--

Column 15, Line 53, Claim No. 35:

Change "the second" to --the second sidewall--

Signed and Sealed this

Seventh Day of August, 2007

JON W. DUDAS
*Director of the United States Patent and Trademark Office*